United States Patent
Hibino

(10) Patent No.: US 7,957,200 B2
(45) Date of Patent: Jun. 7, 2011

(54) SEMICONDUCTOR MEMORY DEVICE AND READ ACCESS METHOD THEREOF

(75) Inventor: Kenji Hibino, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 35 days.

(21) Appl. No.: 12/612,194

(22) Filed: Nov. 4, 2009

(65) Prior Publication Data

US 2010/0118612 A1    May 13, 2010

(30) Foreign Application Priority Data

Nov. 7, 2008  (JP) ................................. 2008-286965

(51) Int. Cl.
*G11C 16/00*  (2006.01)

(52) U.S. Cl. ..................... 365/185.25; 365/63; 365/194; 365/203

(58) Field of Classification Search .................. None
See application file for complete search history.

(56) References Cited

U.S. PATENT DOCUMENTS

| | | | |
|---|---|---|---|
| 4,774,691 A * | 9/1988 | Hidaka | 365/203 |
| 7,085,189 B2 | 8/2006 | Horii et al. | |
| 7,555,659 B2 * | 6/2009 | Lines | 713/300 |
| 2005/0082579 A1 | 4/2005 | Horii et al. | |

FOREIGN PATENT DOCUMENTS

| | | |
|---|---|---|
| JP | 2001-035167 A | 2/2001 |
| WO | 03/073430 A1 | 9/2003 |

* cited by examiner

*Primary Examiner* — Tan T. Nguyen
(74) *Attorney, Agent, or Firm* — Sughrue Mion, PLLC

(57) ABSTRACT

The semiconductor memory device includes a plurality of memory cell arrays and a control circuit that outputs a first signal and a second signal. The first signal instructs start of precharging of each memory cell array. The second signal instructs completion of the precharging and transition to a read access. The first signal is wired through one or more delay circuits to arrive at each memory cell array with a time difference, and the second signal is wired not through the one or more delay circuits.

12 Claims, 11 Drawing Sheets

SEMICONDUCTOR MEMORY DEVICE AND READ ACCESS METHOD THEREOF

REFERENCE TO RELATED APPLICATION

This application is based upon and claims the benefit of the priority of Japanese patent application No. 2008-286965 filed on Nov. 7, 2008, the disclosure of which is incorporated herein in its entirety by reference thereto.

FIELD OF THE INVENTION

The present invention relates to a semiconductor memory device including a plurality of memory cell arrays in which precharging is performed before a read operation. More specifically, the invention relates to a semiconductor memory device in which a memory cell array is a flash memory cell array.

BACKGROUND

Patent Document 1 describes a semiconductor integrated circuit including a plurality of sense amplifiers. When the sense amplifiers are simultaneously driven and then peak current flows, power supply noise may be generated and a power supply voltage may be reduced. In order to prevent such a phenomenon, each of the sense amplifiers is driven at an independent timing in this semiconductor integrated circuit.

Patent Document 2 describes a flash memory including a plurality of memory cell arrays. In this flash memory, in addition to shifting timings of driving respective sense amplifiers, a precharge timing is also shifted for each memory cell array, thereby preventing precharge current concentration.

[Patent Document 1] JP Patent Kokai Publication No. JP-P2001-35167A

[Patent Document 2] WO2003/073430A1 Pamphlet

SUMMARY

The entire disclosures of Patent Documents 1 and 2 are incorporated herein by reference thereto.

The following analysis is given by the present invention. According to Patent Document 2, the phase of each of control signals (indicated by reference numerals RPC0 and RPC1 in FIGS. 5 and 6) is delayed for each memory bank (memory cell array), using a corresponding one of shift registers (indicated by reference numerals 61, 62, 63 in FIG. 1). Then, according to the phase of the control signal, start and finish timings of precharging are determined. When a read operation from the memory is performed, there is often allowance in timing before an address is determined. Then, after the address has been determined, however, a high-speed read is often needed. In such a case, the following arrangement may be desired. That is, while there is allowance in timing before the address is determined, precharging is started by shifting a precharge timing for each memory cell array, thereby avoiding precharge current concentration. Then, completion of the precharging is performed in common among the respective memory cell arrays. In such a case, assume that start and finish timings of the precharging are determined by one control signal and a timing of the control signal is just delayed by a delay circuit or the like, as in Patent Document 2. Then, when start of the precharging is delayed, completion of the precharging is also delayed. Thus, the high-speed read in connection with address determination cannot be therefore performed.

As described above, it is desired that, in a semiconductor memory device in which precharging is performed before a read operation, a precharge current peak value can be reduced, and a high-speed read operation can be performed.

A semiconductor memory device according to one aspect of the present invention includes:

a plurality of memory cell arrays; and a control circuit that outputs a first signal and a second signal, the first signal instructing start of precharging of each of the memory cell arrays, the second signal instructing completion of the precharging and transition to a read access. The first signal is wired through one or more delay circuits so that the first signal arrives at each of the memory cells with a time difference, and the second signal is wired not through the one or more delay circuits.

A read access method of a semiconductor memory device according to another aspect of the present invention is a read access method of a semiconductor memory device including a plurality of memory cell arrays. In the method, precharging of the respective memory cell arrays is started by sequentially shifting timings of the precharging, and a read access to a selected one of the memory cell arrays is started at substantially a same timing as a timing at which the precharging is completed, without depending on the order of starting the precharging.

The meritorious effects of the present invention are summarized as follows.

According to the present invention, the first signal is wired through the one or more delay circuits so that the first signal arrives at each memory cell array with a time difference. Thus, precharge current concentration can be avoided. Further, the second signal is wired not through the one or more delay circuits. Thus, a high-speed read operation can be implemented.

PREFERRED MODES

Figure 1:
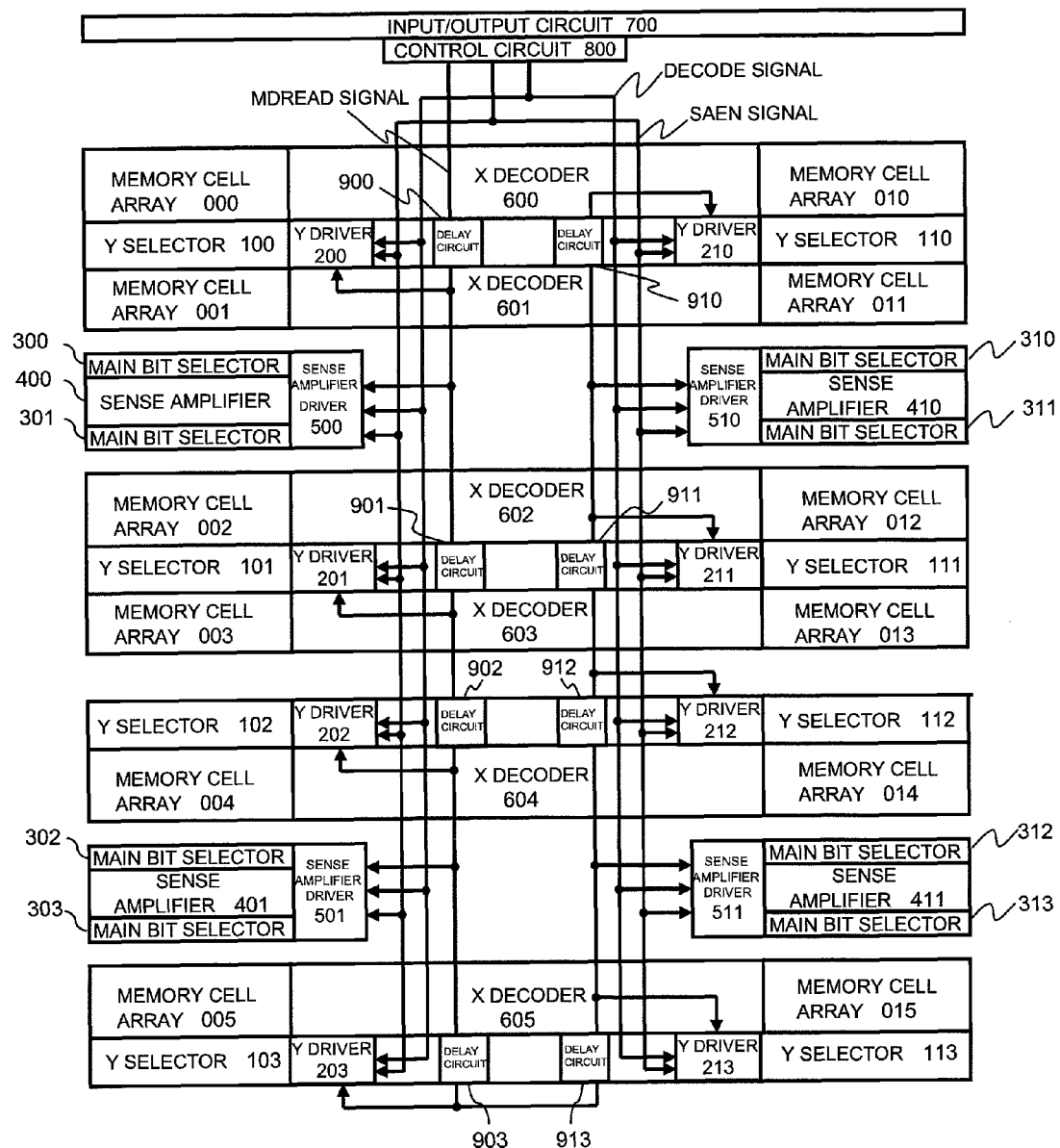
FIG. 1 is a block diagram of an entire portion of a semiconductor memory device according to an example of the present invention.

Exemplary embodiments of the present invention will be described with reference to drawings as necessary. The drawings and reference numerals in the drawings cited in the description of the exemplary embodiments are shown as examples of the exemplary embodiments, and do not thereby limit variations of the exemplary embodiments according to the present invention.

Figure 8:
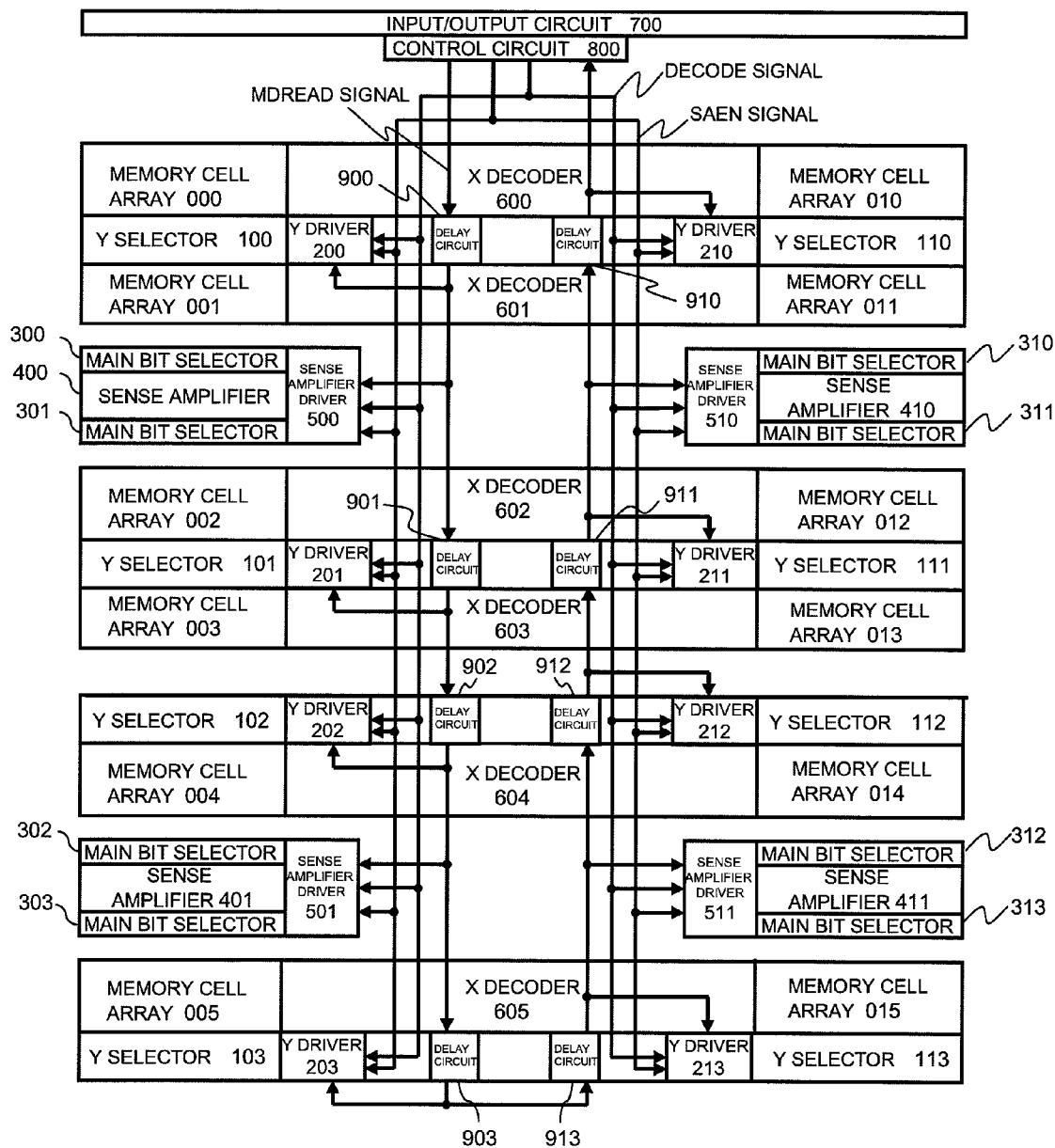
FIG. 8 is a block diagram of an entire semiconductor memory device according to another example of the present invention.

As shown in FIGS. 1 and 8, for example, a semiconductor memory device in one exemplary embodiment of the present invention includes a plurality of memory cell arrays (000 to 005 and 010 to 015, with Y selectors 100 to 113 and Y drivers 200 to 213 included in addition to the memory cell arrays), a control circuit 800 which outputs a first signal (MDREAD) that instructs start of precharging to each memory cell array and a second signal (SAEN) that instructs completion of the precharging and transition to a read access. The first signal (MDREAD) is wired through delay circuits (900 to 913) so that the first signal arrives at each memory cell array with a time difference. The second signal (SAEN) is wired not through the delay circuits (900 to 913).

Figure 6:
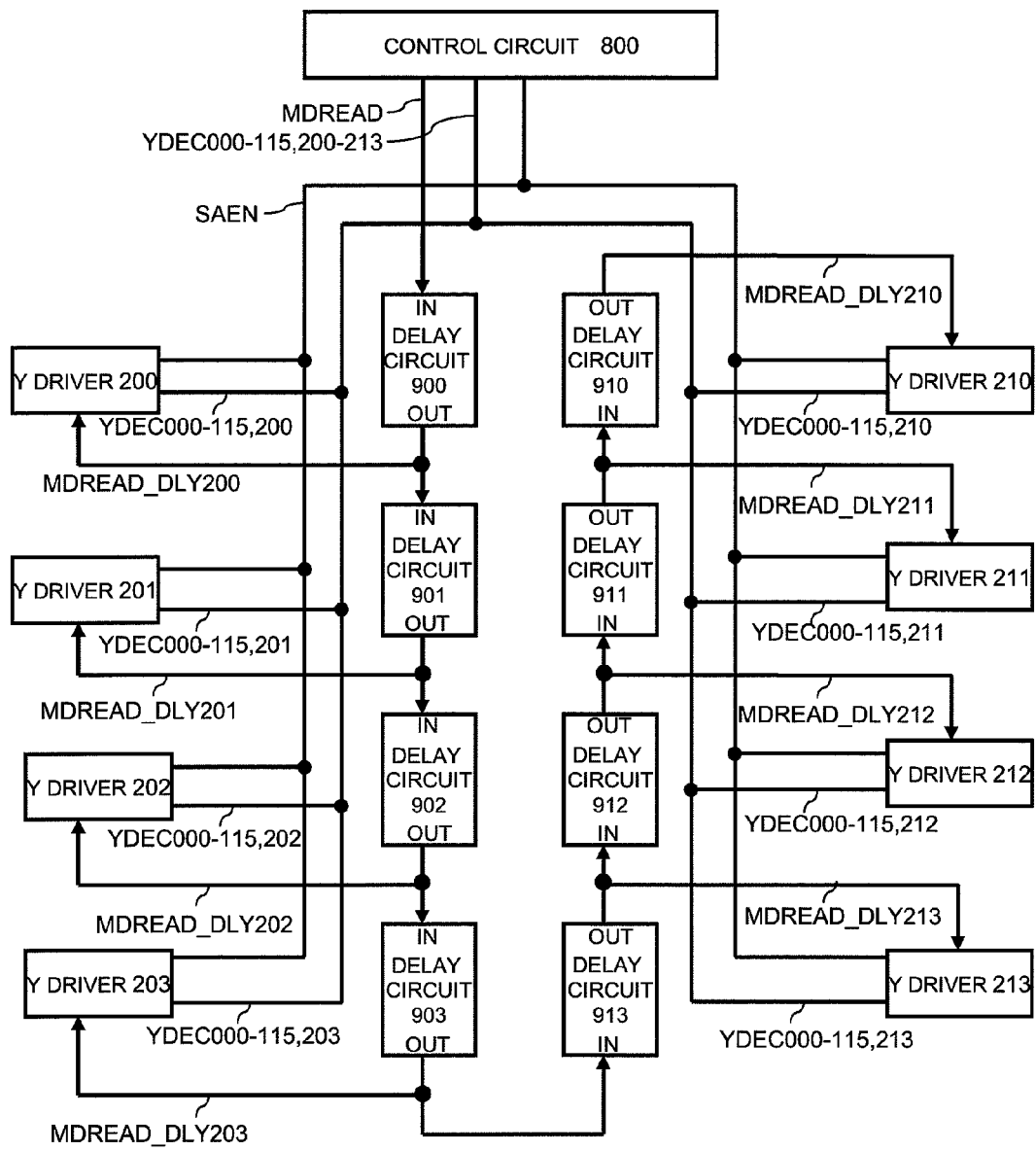
FIG. 6 is a connection diagram between a control circuit and Y drivers in the example of the present invention.
Figure 9:
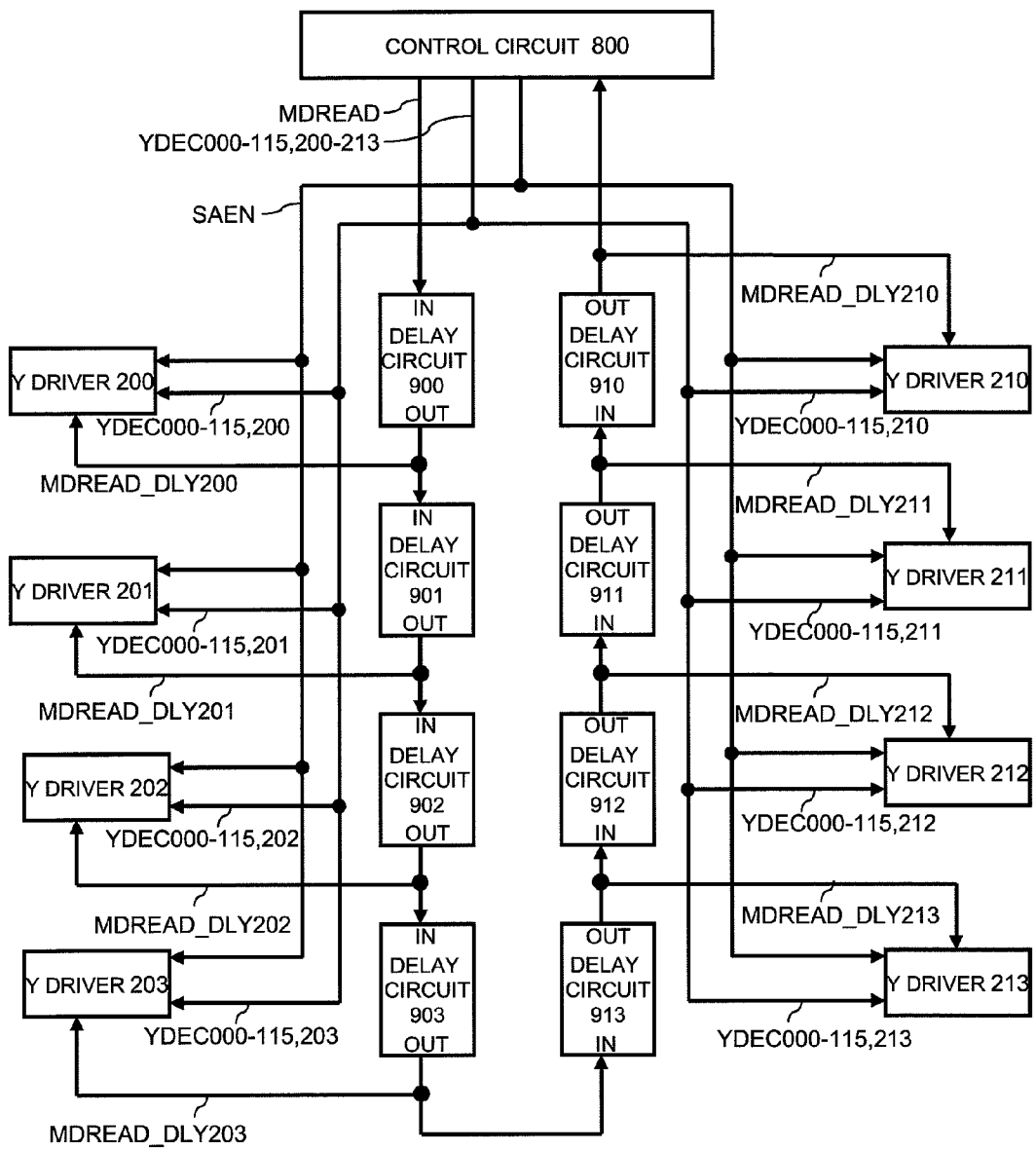
FIG. 9 is a connection diagram between the delay circuits and the Y drivers in another example of the present invention.

As shown in FIGS. 6 and 9, for example, in the semiconductor memory device in the one exemplary embodiment, the delay circuits (900 to 913) may be connected in series from the control circuit 800. The first signal (MDREAD) may be branched from an output of each of the delay circuits (900 to 913) connected in series and then, may be connected to each of the memory cell arrays (Y driver 200 to 213).

The first signal of the semiconductor memory device described above may be a read mode signal (MDREAD). Further, when a read mode continues even after transition to a read access has been made, the second signal (SAEN) may be inactivated, thereby finishing the read access and resuming the precharging. In some of flash memories or the like, for example, when precharging is initially performed after transition to the read mode from other mode, a large precharge current may flow. Unless a large precharge current flows even if the precharging is performed again once after transition to the read mode has been made, start of the precharging may be delayed through the delay circuits only at a time of transition to the read mode. That is, only when transition from the read mode from other mode is made, the precharging may be started in response to the first signal. Then, when a read operation is continued, switching between the precharging and the read operation may be made according to a logic level of the second signal. With this arrangement, it takes time to start initial precharging, but it does not take time to start the precharging at a second time. Thus, high-speed successive reads may be performed to arbitrary addresses.

The second signal may be a timing signal (SAEN) for sense amplifier control, or a signal to be output in connection with address determination. Further, the second signal may be an address selection signal (such as a signal YDEC200). Generally, at a start of precharging, an address from which a read is performed does not need to be determined. However, when a precharging operation is finished and transition to a read access is to be made, the address from which the read is performed needs to be determined. The signal based on which this read access is made may be the timing signal (SAEN) for sense amplifier control, the signal to be output in connection with address determination, or the address selection signal, as described above.

Figure 2:
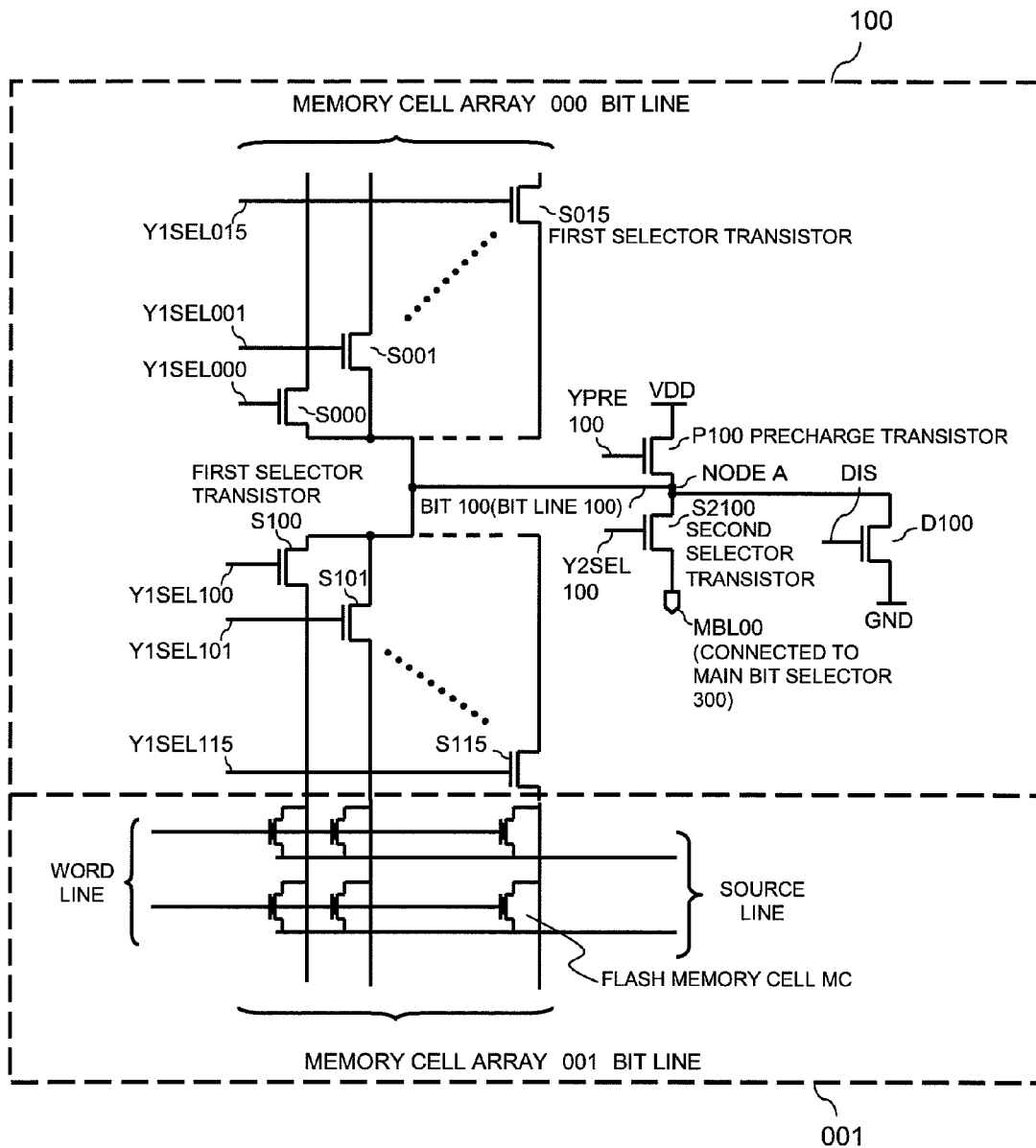
FIG. 2 is a block diagram of a Y selector in the example of the present invention.
Figure 3:
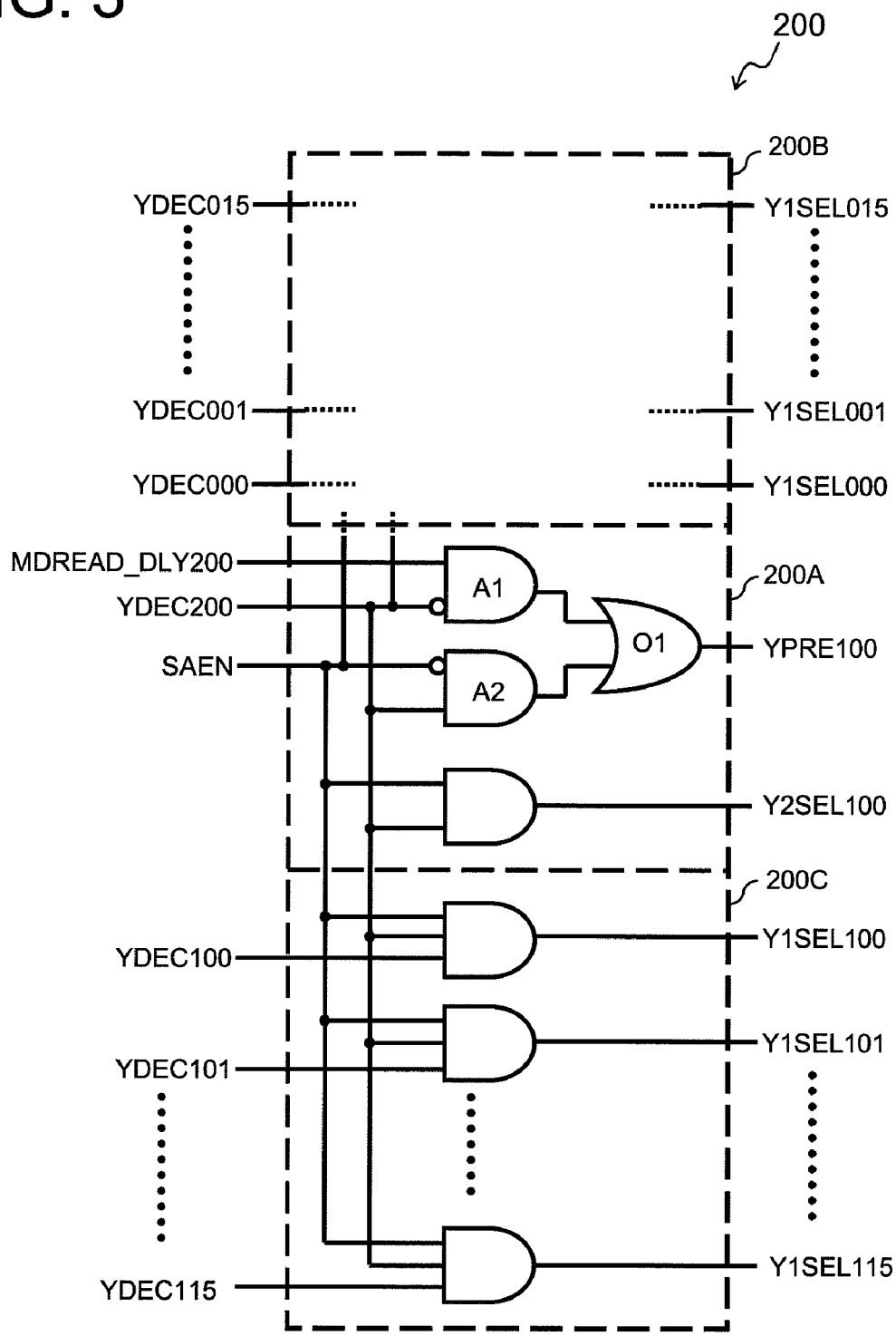
FIG. 3 is a block diagram of a Y driver in the example of the present invention.
Figure 7:
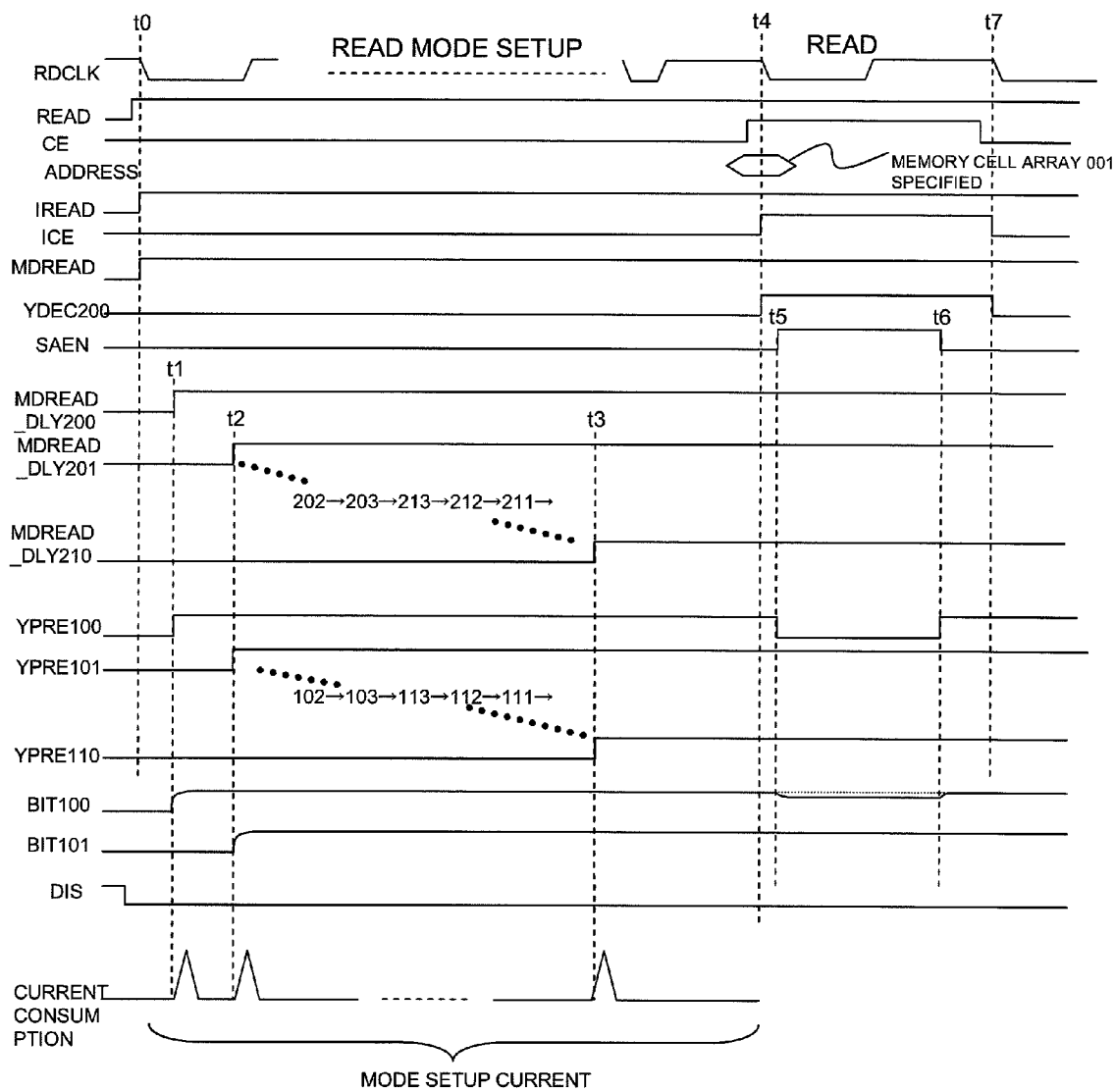
FIG. 7 is a timing chart of the semiconductor memory device in the example of the present invention.

As shown in FIGS. 2, 3 and 7, for example, even when precharging is finished and transition to a read access is made in one of the memory cell arrays at a selected address in the semiconductor memory device in the one exemplary embodiment, the memory cell arrays at addresses that are not selected may continue a precharging state. By maintaining the precharging state in the memory cell arrays at the addresses that are not selected, the circuit can be stabilized, and wasteful current consumption can be reduced.

As shown in FIG. 2, in the semiconductor memory device in the one exemplary embodiment, a potential at a bit line in each memory cell array may be fixed to a first potential (GND) before receipt of the first signal (MDREAD), and then, may be precharged to a second potential (VDD) upon receipt of the first signal. According to an example in FIG. 2, for example, transition from other mode to the read mode is made after passing through a disenable mode (in which a signal DIS is high) and fixing the potential at the bit line to the ground potential. Thus, a stress on and a malfunction of a cell at a time of mode transition can be avoided.

Figure 10:
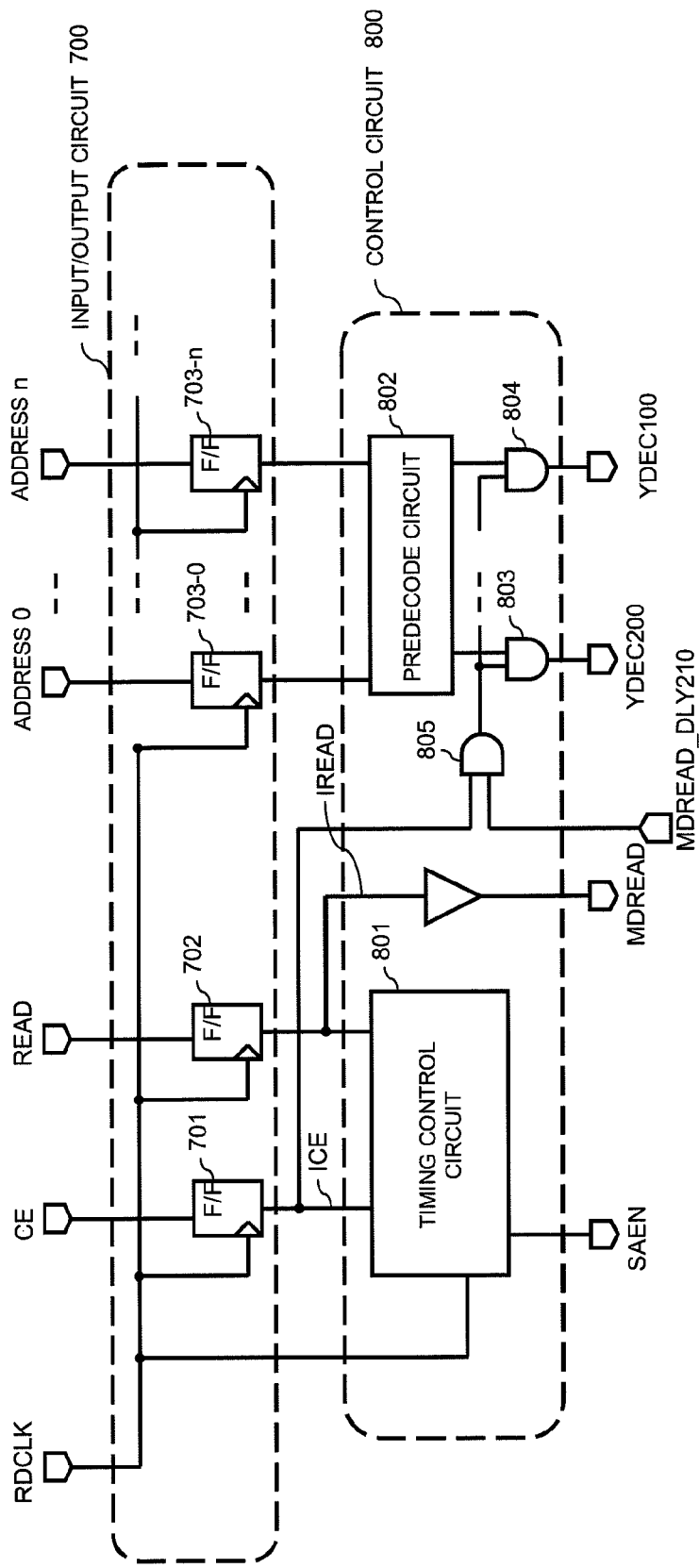
FIG. 10 is a block diagram of the input circuit and the control circuit in another example of the present invention.

As shown in FIGS. 8 to 10, the semiconductor memory device in the one exemplary embodiment is so configured that the end of a wire of the first signal (MDREAD) is feedback connected to the control circuit 800, and the second signal (decode signal YDEC200) is output from the control circuit 800 upon receipt of the feedback connected first signal MDREAD. With the configuration described above, after ensuring that precharging has been performed, transition to a read operation is made.

Further, as shown in FIG. 2, each of the memory cell arrays may be an array of a flash memory cells MC.

A read access method of a semiconductor memory device in one exemplary embodiment is a read access method of a semiconductor memory device including a plurality of memory cell arrays. In this method, precharging of the memory cell arrays is started by sequentially shifting timings of the precharging, and a read access to a selected one of the memory cell arrays is started at substantially a same timing as a timing at which the precharging is completed, without depending on the order of starting the precharging. That is, after the memory cell arrays have been sequentially precharged, the read access to any one of the memory cell arrays is started at substantially the same timing as that of the completion of the precharging. Accordingly, a precharge current peak can be dispersed, and a high-speed access after address determination can be ensured. The semiconductor memory device and the read access method of the semiconductor memory device in the exemplary embodiments described above will be described in further detail in connection with examples with reference to drawings.

First Example

FIG. 1 is a block diagram showing an entire semiconductor memory device according to a first example. The semiconductor memory device shown in this FIG. 1 includes flash memory cell arrays, and functions as a flash memory macro as a whole. This flash memory macro can be incorporated into a one-chip semiconductor integrated circuit, together with other functional blocks. This flash memory macro can also be used as an independent one-chip semiconductor memory chip.

Referring to FIG. 1, reference numerals 000 to 005 and 010 to 015 denote memory cell arrays formed of flash memories. In these memory cell arrays, the memory cell arrays 000 to 005 are arranged on the left side of X decoders 600 to 605, and the memory cell arrays 010 to 015 are arranged on the right side of the X decoders 600 to 605.

Reference numerals 100 to 103 and 110 to 113 denote Y selectors, which perform bit line selection and precharging of the memory cell arrays. Reference numerals 200 to 203 and 210 to 213 denote Y drivers. Each Y driver outputs a signal that drives a corresponding one of the Y selectors. Reference numerals 300 to 303 and 310 to 313 denote main bit selectors.

Each main bit selector selects which one of upper and lower main bit lines is connected to a corresponding sense amplifier. Reference numerals 400, 401, 410, and 411 denote sense amplifiers, and are circuits each of which reads information from a cell through a bit line. Reference numerals 500, 501, 510, and 511 denote sense amplifier drivers, each of which outputs signals that drive a corresponding one of the sense amplifiers and a corresponding one of the main bit selectors. Reference numerals 600 to 605 denote X decoders, each of which selects a word line in a corresponding one of the memory cell arrays. Reference numeral 700 denotes an input/output circuit that receives an access signal for the flash memory macro from an outside and outputs data read from the flash memory macro to the outside. Reference numeral 800 denotes a control circuit which generates control signals about an operation mode, an address, and a timing of the flash memory macro from signals supplied to the input/output unit 700, and controls an entire portion of the flash memory macro. Reference numerals 900 to 903 and 910 to 913 denote delay circuits. Each delay circuit delays a read mode signal MDREAD output from the control circuit 800 and transmits the delayed read mode signal MDREAD to each Y driver. From the control circuit 800, a decode signal and a sense amplifier control signal SAEN are output, in addition to the read mode signal. These signals are wired to each memory cell array. As the decode signal, in addition to the decode signal (indicated by each of reference numerals YDEC000 to YDEC015, YDEC100 to YDEC115, YDEC200 to YDEC203, and YDEC210 to YDEC 213, which will be described later in detail) connected to each Y driver, there is also a decode signal connected to each X decoder. FIG. 1 illustrates the decode signal connected to each Y driver.

FIG. 1 shows a portion where the memory cell arrays are vertically disposed with the corresponding Y selector sandwiched therebetween (e.g., the memory cell arrays 000 and 001 are vertically disposed with the Y selector 100 sandwiched therebetween) and a portion where the memory cell array is disposed on just one side of the corresponding Y selector (e.g., no memory cell arrays are disposed on an upper side of the Y selector 102 and on a lower side of the Y selector 103). In the portion where the memory cell array is disposed just on the one side of the Y selector, the memory cell array can be added to a vacant part, as necessary.

FIG. 2 is a block diagram of the Y selector 100 in the first example. FIG. 2 illustrates a part of a configuration of the memory cell array 001 as well. Respective bit lines of the memory cell array 001, to which flash memory cells MC are connected, are connected to a node A through corresponding first selector transistors S100 to S115, respectively. Similarly, respective bit lines of the memory cell array 000, to which flash memory cells MC are connected, are connected to the node A through corresponding first selector transistors S000 to S015, respectively. Selection signals Y1SEL_000 to Y1SEL_015 are respectively connected to gates of the first selector transistors S000 to S015, and selection signals Y1SEL_100 to Y1SEL_115 are respectively connected to gates of the first selector transistors S100 to S115. When a selected one of the first selector transistors S000 to 5015 and the first selector transistors S100 to S115 is turned on, a bit line corresponding to the selected transistor is connected to the node A. A source of a second selector transistor S2100 is connected to the node A, and a drain of the second selector transistor S2100 is connected to a main bit line MBL00. A control signal Y2SEL100 thereby controls selection. A bit line to which the respective bit lines are connected in common and the node A in this Y selector 100 will be referred to as a bit line 100. Similarly, common bit lines of the Y selectors 101 to 103 and the Y selector 110 to 113 (See FIG. 1), each of which is equivalent to the bit line at the node A, will be respectively referred to as bit lines 101 to 103 and bit lines 110 to 113.

A precharge transistor P100 and a discharge transistor D100 are further connected to the node A. The precharge transistor P100 pulls up the node A to VDD in response to a control signal YPRE100 when corresponding memory cell arrays are in a read mode and in a non-selection state. When mode switching is made from other mode to the read mode, the discharge transistor D100 pulls down the node A to ground in response to a disenable mode signal DIS.

FIG. 3 is a block diagram of the Y driver 200 in the first example. The Y driver 200 includes a circuit 200A that selects an entire portion of the Y selector 100, a circuit 200B that generates a bit line selection signal for the memory cell array 000, and a circuit 200C that generates a bit line selection signal of the memory cell array 001. Circuit configurations of the circuits 200B and 200C are the same just with a difference between input address signals thereof. Thus, FIG. 3 shows an internal circuit of the circuit 200C on behalf of the circuit 200B, and a description of an internal circuit of the circuit 200B is omitted.

The first selector transistor control signals Y1SEL000 to Y1SEL015 and Y1SEL100 to Y1SEL115 are generated from address decode signals YDEC000 to YDEC015, YDEC100 to YDEC115, and YDEC200 which are decoded by the control circuit 800 and the sense amplifier control signal SAEN which is a timing signal used for sense amplifier control.

The second selector control signal Y2SEL100 is generated from the address decode signal YDEC200 that is decoded by the control circuit 800 and the sense amplifier control signal SAEN. The control signal YPRE100 for the precharge transistor P100 is generated by an AND circuit A1 for a read mode signal MDREAD_DLY200 that is delayed and the inverted signal of the address decode signal YDEC200, an AND circuit A2 for the address decode signal YDEC200 and the inverted signal of the sense amplifier control signal SAEN, and an OR circuit O1 for an output of the AND circuit A1 and an output of the AND circuit A2.

Figure 4:
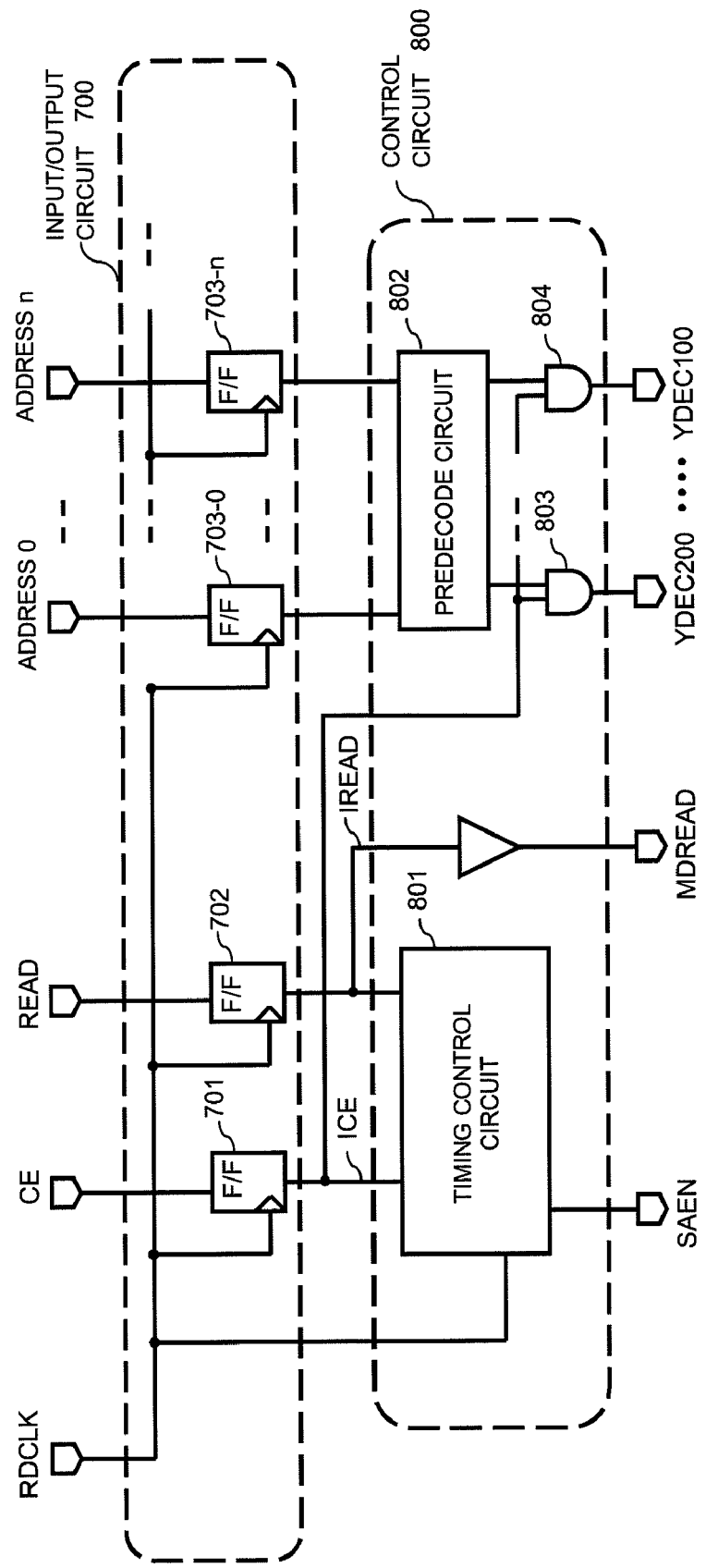
FIG. 4 is a block diagram of an input circuit and a control circuit in the example of the present invention.

FIG. 4 is a block diagram of the input/output circuit 700 and the control circuit 800 in the first example. Referring to FIG. 4, only signals and circuit blocks related to a circuit operation of the present invention are shown, and a description of a signal output to the outside from the input/output circuit 700 and the like is omitted. Input signals CE and READ, and addresses 0 to n are supplied to the input/output circuit 700 from the outside and are captured into flip-flops 701, 702, and 703-0 to 703-n in response to a clock signal RDCLK supplied from the outside. The captured signals are supplied to the control circuit 800.

The input signal READ is a mode signal that sets the flash memory macro to the read mode. When the input signal READ at a high level at the READ terminal is captured in synchronization with the clock signal RDCLK, the flash memory macro is set to the read mode. The input signal CE is a chip enable signal. When the input signal CE is high, the flash memory macro in this example is enabled to be operable. The clock signal RDCLK is a clock that drives the flip-flops 701, 702, 703-0 to 703-n of the input/output circuit 700 and is a clock signal that also serves as a trigger for an internal operation. The addresses 0 to n are address signals for the flash memory macro. In the read mode, data in the flash memory at an address supplied in the form of one of the addresses 0 to n is output to the outside.

Figure 11:
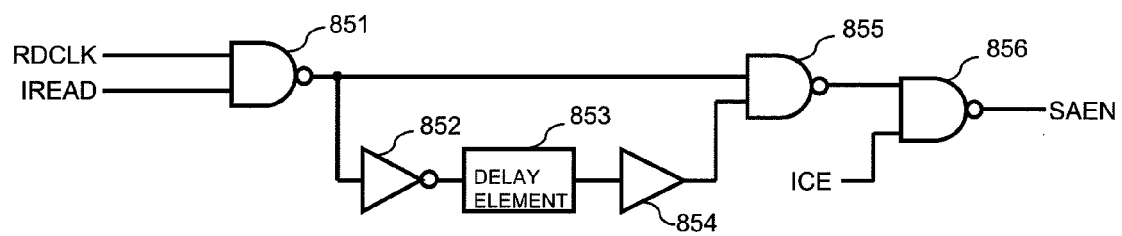
FIG. 11 is a block diagram of a timing control circuit in the example of the present invention.

The control circuit 800 includes a timing control circuit 801, a mode control circuit, and a predecode circuit 802. The timing control circuit 801 outputs the sense amplifier control signal SAEN in synchronization with the clock signal RDCLK when an IREAD signal is high and an ICE signal is also high (in the read mode and in an enable state). A block diagram of this timing control circuit will be shown in FIG. 11.

The mode control circuit buffers the IREAD signal and outputs the buffered IREAD signal as the MDREAD signal, in the read mode. The predecode circuit outputs a signal obtained by decoding a latched address signal as a decode signal, when the ICE signal is high.

FIG. 6 is a connection diagram between the control circuit 800 and the Y drivers (200 to 203, 210 to 213) in the first example. This FIG. 6 describes the control circuit, Y drivers, and delay circuits in view of relative layout positions of the control circuit, Y drivers, and delay circuits in an actual semiconductor integrated circuit. The read mode signal MDREAD is wired from the control circuit 800 to the Y drivers 200 to 203 and 210 to 213 in the respective memory cell arrays through delay circuits 900 to 903 and 910 to 913. The read mode signal MDREAD output from the control circuit 800 is wired to go around an entire portion of the memory cell array through the delay circuits. The delayed read mode signals MDREAD_DLY 200 to 213 output from the respective delay circuits are supplied to the respective Y drivers.

In addition to the read mode signal MDREAD, the decode signals (YDEC000 to YDEC015, YDEC100 to YDEC115, YDEC200 to YDEC 203, and YDEC210 to YDEC213) and the sense amplifier control signal SAEN are wired to the respective Y drivers. Wiring of the read mode signal MDREAD to go around the memory cell array through the delay circuit is laid out with what is called one stroke so that an arrival time of the signal at each Y driver from the control circuit 800 is different. On contrast therewith, the decode signals and the sense amplifier control signal SAEN are wired at a minimum distance so that signal arrival times of the decode signals and the sense amplifier control signal SAEN at each driver are substantially the same. The read mode signal is wired through the delay circuits starting from the Y driver 213 that is the most distant from the control circuit 800, and the Y driver 212, and the Y driver 211, in this stated order, for example. The end of the wiring is the Y driver 210, which is the nearest to the control circuit 800.

On the other hand, the decode signals and the sense amplifier control signal SAEN described above are wired in the order of the Y drivers 210, 211, 212, and 213, starting from the Y driver 210 which is the nearest to the control circuit 800. The decode signals and the sense amplifier control signal SAEN are wired so that a delay time difference caused by the wiring is generated as little as possible. The read mode signal MDREAD is wired through the delay circuits so that the signal arrives at each Y driver with a time difference. The reason for this arrangement is to shift a timing of flow of precharge current for each memory cell array, thereby avoiding precharge current concentration. The decode signals and the sense amplifier control signal SAEN are wired so that no arrival time difference between the signals at each Y driver is generated. The reason for this arrangement is to cause an access time not to differ, depending on the memory cell array. The access time extends from address determination to completion of an access such as a read.

The decode signals YDEC000 to YDEC 015 and the decode signals YDEC 100 to YDEC 115 related to the Y drivers, which are output by the control circuit 800, are common to the respective Y drivers. The decode signals YDEC200 to YDEC 203, YDEC 210 to YDEC 213 are individual decode signals for the respective Y drivers. The control circuit 800 can appropriately determine to which extent predecoding is performed and from where reminder of decoding is performed at each Y driver, as necessary.

Figure 5:
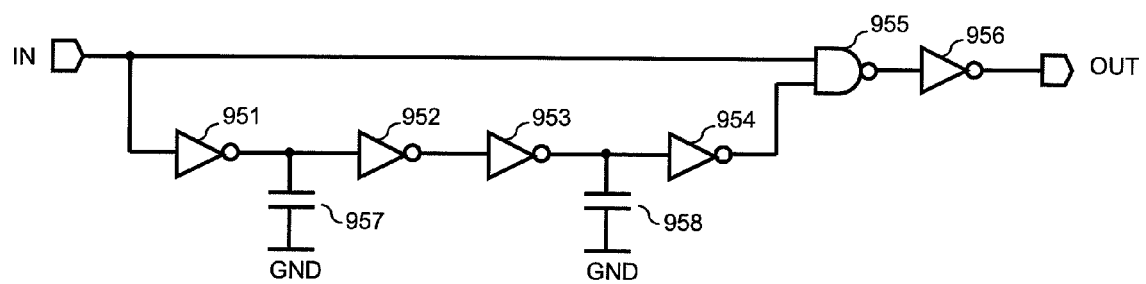
FIG. 5 is a block diagram of a delay circuit in the example of the present invention.

An arbitrary configuration may be used for each of the delay circuits 900 to 903 and 910 to 913 in FIG. 6. An example of the arbitrary configuration will be shown in FIG. 5. In the delay circuit in FIG. 5, an input signal IN is delayed by inverters 951, 952, 953, and 954 and capacitances 957 and 958. A logical AND operation is performed on the input signal IN and the delayed input signal by a NAND circuit 955 and an inverter 956, thereby generating an output signal OUT in phase with the input signal IN, a rise of which is delayed from the input signal IN.

In addition to the read mode signal MDREAD, the sense amplifier control signal SAEN, decode signals YDEC200, YDEC000 to YDEC015, YDEC100 to YDEC 115, a predecode signal not shown for an X decoder are output from the control circuit 800 to the memory cell array. The signals other than the read mode signal MDREAD does not need to be delayed by the delay circuit. While the address decode signals YDEC000 to YDEC015 and YDEC100 to YDEC115 are output in common to the respective memory cell arrays, the address decode signal YDEC200 is the signal output to the Y driver 200 alone. A similar signal to the address decode signal YDEC200 is individually output to each Y driver from the control circuit 800.

An operation mode in the flash memory macro in the first example will be described. In a common flash memory, an erase (erase) mode for performing an erasure, a write mode for performing a write, a verify mode for testing whether a write could be correctly performed after the write, and the like are present, in addition to the already-described read mode. In the flash memory, a high voltage is needed for the write and the erasure, and an applied voltage significantly differs depending on the mode. Thus, it is necessary to prevent a malfunction or LSI breakdown caused by a careless change of the mode. For this reason, a disenable mode is provided. Then, when switching of one of the above-mentioned modes is made, the switching to other mode is invariably made after passing through the disenable mode.

FIG. 7 is a timing chart of the semiconductor memory device (flash memory macro) in the first example. When data is read from the flash memory macro in the first example, it is necessary to first perform read mode setup and set the operation mode to the read mode. It is assumed that, referring to FIG. 7, at a timing before timing t0, the disenable mode signal DIS is high and the operation mode is in the disenable mode. It is further assumed that the chip enable signal CE is low. In this case, the discharge transistor D100 shown in FIG. 2 is on. Thus, the bit line BIT100 (bit line 100, which is the common bit line for the Y selector 100 at the node A in FIG. 2) is at a ground potential. Next, when the disenable mode signal DIS falls before the timing t0 and a READ signal shown in FIG. 4 rises, the READ signal is captured by the flip-flop 702 in the input/output circuit 700 at a fall of the clock signal RDCLK at the timing t0, thereby driving the IREAD signal high. When the disenable mode signal DIS falls, the discharge transistor D100 is turned off. Then, the node A at each bit line assumes a high-impedance state.

On the other hand, the IREAD signal is buffered by the control circuit 800. Then, the MDREAD signal goes high. During a period of the read mode set up, the chip enable signal CE maintains low. Accordingly, the predecode circuit 802 and circuits 803 and 804 maintain a non-selection state where all the decode signals at a low level are output. The read mode signal MDREAD is delayed by the delay circuits 900 to 903 and the delay circuits 910 to 913 which are shown in FIG. 6 and are connected in series, and is then transmitted to the respective Y drivers. First, at timing t1, the read mode signal MDREAD_DLY200 delayed through the delay circuit 900 goes high from low. The address decode signal YDEC200 and the sense amplifier control signal SAEN output by the control circuit 800 shown in FIG. 4 maintain low. Thus, the precharge signal YPRE100 changes to high by the AND circuits A1 and A2 and the OR circuit O1 shown in FIG. 3. Then, the precharge transistor P100 of the Y selector 100 in FIG. 2 is turned on. The bit line 100 (BIT100, or the node A of the Y selector 100) thereby starts to be charged from a ground level to a VDD level. On this occasion, charging current flows through the bit line 100 of the Y selector 100 as shown in FIG. 7, and the bit line 100 is charged. However, in this stage, the MDREAD signal has not arrived yet at the Y selectors other than the Y selector 100. Thus, bit line charging is not started. Accordingly, the charging current of the bit line flows through the bit line 100 of the Y selector alone.

Next, at timing t2, the read mode signal MDREAD_DLY201 of the read mode signal MDREAD that has been delayed through the delay circuit 901 goes high. When the read mode signal MDREAD_DLY201 rises, a precharge signal YPRE101 for the Y selector 101 output from the Y driver 201 goes high. When the precharge signal YPRE101 goes high, a bit line 101 (BIT101 in FIG. 7) of the Y selector 101 is charged from the ground level to the VDD level. On this occasion, bit line charging current for the Y selector 101 flows. Similarly, the read mode signal MDREAD is transmitted to the respective Y selectors, being delayed through the delay circuits 900 to 903 and 910 to 913 as shown in FIG. 6. The respective bit lines of the Y selectors are charged from the ground level to the VDD level. In this case, the MDREAD signal is transmitted, being delayed by the delay circuits 900 to 903 and 910 to 913. Thus, no concentration of flow of the bit line charging current of each Y selector occurs. The timing of flow of the charging current can be dispersed by passing the MDREAD signal through the delay circuits.

At timing t3, the read mode signal MDREAD is transmitted to the delay circuit 910 in the final stage of the delay circuits connected in series. Then, the read mode signal MDREAD_DLY 210 rises, and then a bit line 110 of the Y selector 110 is charged according to a precharge signal YPRE110. This completes charging of the bit lines of all the Y selectors.

When the chip enable signal CE is maintained low during the read mode set up period which is a bit line charging period of each Y selector, the predecode circuit 802 and the circuits 803, and 804 in FIG. 4 assume the non-selection state where all the decode signals at the low level are output.

When charging of the bit lines of all the Y selectors is completed after transmission of the MDREAD signal to the end of the delay circuits connected in series, the read mode setup is completed. The chip enable signal CE is then driven high, and a read operation is thereby started. An address signal captured by the input/output circuit 700 is predecoded by the predecode circuit 802, and is output from the control circuit 800 as a predecode signal. It is herein assumed that at a first fall (at timing t4) of the clock signal RDCLK after a rise of the chip enable signal CE, the memory cell array 0001 is selected. Then, the decode signal YDEC200 goes high by the predecode circuit 802 and the circuit 803. When the decode signal YDEC goes high, the AND circuit A1 of the Y driver 200 in FIG. 3 goes low. However, the AND circuit A2 goes high to the contrary. Thus, an output of the precharge signal YPRE100 maintains high. A precharging state is thereby maintained in this stage.

At timing t5 slightly delayed from timing t4, the sense amplifier control signal SAEN goes high. Then, an output of the AND circuit A2 goes low from high, and the precharge signal YPRE100 also goes low from high. Then, precharging of the bit line 100 (node A) of the Y selector 100 is released. Further, one of the first selector transistor control signals Y1SEL100 to Y1SEL115 goes high according to an input address. Then, the selected bit line of the memory cell array is connected to the node A. Then, a potential at the memory cell selected by the word line is transmitted to the sense amplifier 400 through the bit line of the memory cell array 001, common bit line 100 (node A) of the Y selector 100, second selector transistor S2100, and main bit selector 300. The sense amplifier 400 amplifies a bit line potential difference, and outputs data to outside the flash memory macro through the input/output circuit 700.

The precharging is released at timing t5 at the selected Y selector alone, and the Y selectors 101 to 103 and 110 to 113 other than the Y selector 100 continue the precharging state.

Next, at timing t6, data reading by the sense amplifier 400 is completed, and the sense amplifier control signal SAEN is driven low. Then, the first selector transistor control signals Y1SEL100 to Y1SEL115 in FIG. 3 all go low. Thus, the first selector transistors S100 to S115 all return to an off state. The precharge signal YPRE100 goes high, and the Y selector 100 is returned to the precharging state. As shown in FIG. 7, a reduction in a potential at the bit line (BIT100 in a period between timings t5 and t6, for example) due to data reading from the memory cell is slight in such an extent that the sense amplifier can detect the potential difference from a reference potential so as to ensure a high-speed read operation. Unlike in the disenable mode, the potential is not reduced to the ground potential. Accordingly, precharge current that flows at timing t6 is smaller than precharge current that flows at the time of the read mode set up. When the read mode continues as shown in FIG. 7, precharging is started by driving the sense amplifier control signal SAEN low not through the delay circuits. Thus, unlike when the read mode is set up, it does not take time to start precharging. Accordingly, when the read mode continues, a read operation from an arbitrary address can be performed successively at high speed.

In the first example, transition from the precharging state to the read operation is made by using the sense amplifier control signal. The transition from the precharge state to the read operation is not, however, limited to use of the sense amplifier control signal SAEN. The transition to the read operation can be made immediately after address determination and completion of decoding by the X decoder and the Y driver. In the above-mentioned example, as a signal indicating completion of decoding by the X decoder and the Y driver, the sense amplifier control signal is used. However, the transition to the read operation can be made by using other signal if the signal is output in connection with the address determination. Transition to a precharging operation from the read operation when the read mode is continued can also be made by releasing the signal output in connection with the address determination.

Second Example

FIG. 8 is a block diagram showing an entire semiconductor memory device according to a second example. A description will be given about only a portion different from the block diagram of FIG. 1 showing the entire semiconductor memory device. Same reference numerals as those in the drawing in the first example are assigned to components common to FIG. 1, and descriptions of the components will be omitted. The second example is different from FIG. 1 in the first example in that an output signal of the delay circuit 910 that is the end of the delay circuits (900 to 903, 910 to 913) connected in series which delay a read mode signal MDREAD is fed back to the control circuit 800. Other respects are the same as those in FIG. 1 in the first example.

FIG. 9 is a connection diagram between the control circuit and the Y drivers in the second example. An output of the delay circuit 910 in the final stage of the delay circuits connected in series is feedback connected to the control circuit 800. Other respects are the same as those in the connection diagram in the first example shown in FIG. 6.

FIG. 10 is a block diagram of the input/output circuit and the control circuit in the second example. An AND operation is performed on a signal MDREAD_DLY 210, which is an output signal of the delay circuit 910 in the final stage, and an internal chip enable signal ICE by an AND circuit 805 and the resulting signal is supplied to the AND circuits 803 and 804 for the predecode circuit. With this arrangement, the read mode signal MDREAD is transmitted to the output of the delay circuits in the final stage at a time of read mode setup, and transition to a read operation cannot be made until precharging of all the memory cell arrays is completed.

When the chip enable signal is driven high during the mode setup in the first example, a decode signal within the chip may be driven high, in view of the configuration of the Y driver shown in FIG. 3. In this case, precharging may occur at the two Y selectors, and an operation of sequentially performing precharging according to the present invention may not be maintained. According to the second example, a predecode signal is not output until precharging in the final stage is completed, irrespective of the level of the chip enable signal. Thus, precharging can be sequentially performed, using the delay circuits.

In recent years, a large-capacity and a high-speed read operation are demanded for a flash memory macro installed in a micro computer with a built-in flash memory. An increase in the capacity of the memory macro leads to a corresponding increase in the circuit size. Precharge current that flows through the internal node of the Y selector at a time of the read mode setup described above is particularly significant. Since a lot of selector transistors are connected to this region (such as the node A in FIG. 2), an enormous amount of electrical charges are necessary for pulling up this region. Further, it is necessary to arrange the Y selector for each memory cell array in order to increase the memory capacity and ensure a high-speed read. Accordingly, a problem of a power supply voltage reduction caused by the precharge current at the time of the read mode setup arises. According to the present invention, however, a timing of flow of the precharge current can be shifted for each memory cell array. Thus, the semiconductor memory device, in which peak current at a time of precharging can be reduced and a high-speed read can be achieved, can be provided.

As shown in the examples described above, the present invention is particularly effective for a semiconductor memory device such as a flash memory in which a large precharge current flows at a time of transition to the read mode. The present invention, however, is not limited to that device. The present invention is effective when a precharge current peak value is desired to be reduced in a semiconductor memory device in which precharging is necessary before a read, an access time allowance is provided before address determination, and data needs to be read at a high speed after the address determination.

The above description was given about the present invention in connection with the examples described above. The present invention is not limited to the configurations of the examples described above alone, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
    a plurality of memory cell arrays; and
    a control circuit that outputs a first signal and a second signal, the first signal instructing start of precharging of each of the memory cell arrays, the second signal instructing completion of the precharging and transition to a read access;
    the first signal being wired through one or more delay circuits so that the first signal arrives at each of the memory cell arrays with a time difference, and the second signal being wired not through the one or more delay circuits.

2. The semiconductor memory device according to claim 1, wherein
    the delay circuits are connected in series from the control circuit, and the first signal is branched from an output of each of the delay circuits connected in series and is then connected to each of the memory cell arrays.

3. The semiconductor memory device according to claim 1, wherein the first signal is a read mode signal.

4. The semiconductor memory device according to claim 3, wherein when the read mode continues even after transition to the read access has been made, the second signal is inactivated, thereby finishing the read access and resuming the precharging.

5. The semiconductor memory device according to claim 1, wherein the second signal is a timing signal for sense amplifier control.

6. The semiconductor memory device according to claim 1, wherein the second signal is a signal output in connection with address determination.

7. The semiconductor memory device according to claim 1, wherein the second signal is an address selection signal.

8. The semiconductor memory device according to claim 1, wherein even when the precharging is completed and transition to the read access is made in one of the memory cell arrays at a selected address, a precharging state is continued in the memory cell arrays at unselected addresses.

9. The semiconductor memory device according to claim 1, wherein a potential at a bit line in each of the memory cell arrays is fixed at a first potential before receipt of the first signal and is then precharged to a second potential upon receipt of the first signal.

10. The semiconductor memory device according to claim 1, wherein an end of a wire of the first signal is feedback connected to the control circuit, and the second signal is output from the control circuit upon receipt of the feedback connected first signal.

11. The semiconductor memory device according to claim 1, wherein each of the memory cell arrays is an array of flash memory cells.

12. A read access method of a semiconductor memory device including a plurality of memory cell arrays, comprising:

starting precharging of the respective memory cell arrays by sequentially shifting timings of the precharging; and starting a read access to a selected one of the memory cell arrays at substantially a same timing as a timing at which the precharging is completed, without depending on an order of starting the precharging.

* * * * *